United States Patent
Lin et al.

(10) Patent No.: US 9,130,107 B2
(45) Date of Patent: Sep. 8, 2015

(54) LIGHT EMITTING DEVICE

(75) Inventors: Yi Chieh Lin, Hsinchu (TW); Rong Ren Lee, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 338 days.

(21) Appl. No.: 13/223,033

(22) Filed: Aug. 31, 2011

(65) Prior Publication Data

US 2013/0049042 A1     Feb. 28, 2013

(51) Int. Cl.
*H01L 33/00* (2010.01)
*H01L 33/14* (2010.01)

(52) U.S. Cl.
CPC ............. *H01L 33/14* (2013.01); *H01L 33/0079* (2013.01)

(58) Field of Classification Search
CPC ....... H01L 33/00; H01L 33/14; H01L 33/387; H01L 33/0079; H01L 33/12; H01L 33/30; H01L 33/60
USPC ........... 257/13, 14, 79, 80, 81, 82, 95, 98, 99, 257/183, 189, 200, 414, 431, 432, 613, 615, 257/E33.001, E33.022, E33.036, E33.023, 257/E33.037, E33.048, E33.067, E33.07
See application file for complete search history.

(56) References Cited

U.S. PATENT DOCUMENTS

| | | | |
|---|---|---|---|
| 5,008,718 A * | 4/1991 | Fletcher et al. | 257/96 |
| 5,373,521 A * | 12/1994 | Takahashi | 372/45.01 |
| 5,479,427 A * | 12/1995 | Yoshida et al. | 372/45.01 |
| 5,793,062 A * | 8/1998 | Kish et al. | 257/98 |
| 6,307,873 B1 * | 10/2001 | Geels et al. | 372/46.01 |
| 6,350,997 B1 * | 2/2002 | Saeki | 257/102 |
| 6,617,606 B2 * | 9/2003 | Nakatsu et al. | 257/14 |
| 6,759,689 B2 * | 7/2004 | Adomi et al. | 257/98 |
| 7,087,931 B2 | 8/2006 | Wu et al. | |
| 7,561,609 B2 * | 7/2009 | Fujimoto et al. | 372/50.12 |
| 7,723,731 B2 | 5/2010 | Konno et al. | |
| 8,093,579 B2 * | 1/2012 | Mayer et al. | 257/12 |
| 2007/0007543 A1 * | 1/2007 | Kametani et al. | 257/98 |
| 2007/0045651 A1 * | 3/2007 | Suzuki | 257/102 |
| 2007/0075319 A1 * | 4/2007 | Konno et al. | 257/79 |
| 2007/0075328 A1 * | 4/2007 | Iizuka et al. | 257/103 |
| 2007/0096077 A1 * | 5/2007 | Sanga et al. | 257/13 |
| 2008/0093619 A1 * | 4/2008 | Konno et al. | 257/98 |
| 2009/0010290 A1 * | 1/2009 | Mayer et al. | 372/45.011 |
| 2011/0031528 A1 * | 2/2011 | Nagatake et al. | 257/103 |

* cited by examiner

*Primary Examiner* — Galina Yushina
(74) *Attorney, Agent, or Firm* — Muncy, Geissler, Olds & Lowe, P.C.

(57) ABSTRACT

This disclosure discloses a light-emitting device. The light-emitting device comprises: a substrate; a first light-emitting stack comprising a first active layer; a bonding interface formed between the substrate and the first light-emitting stack; and a contact structure formed on the first light-emitting stack and comprising first, second and third contact layers. Each of the first, second and third contact layers comprises a doping material.

18 Claims, 3 Drawing Sheets

LIGHT EMITTING DEVICE

BACKGROUND

1. Technical Field

The present disclosure relates to a light-emitting device, and in particular to a light-emitting device comprising a contact structure.

2. Description of the Related Art

The light-emitting diodes (LEDs) of the solid-state lighting elements have the characteristics of the low power consumption, low heat generation, long operational life, shockproof, small volume, quick response and good opto-electrical property like light emission with a stable wavelength, so the LEDs have been widely used in household appliances, indicator light of instruments, and opto-electrical products, etc. As the opto-electrical technology develops, the solid-state lighting elements have great progress in the light efficiency, operation life and the brightness, and LEDs are expected to become the main stream of the lighting devices in the near future.

Generally speaking, an operation voltage of a light-emitting device is an important parameter in the lighting devices. If the operation voltage is too high, some adverse effects such as high power consumption or low light efficiency are occurred. Therefore, there is a need for reducing the operation voltage of the light-emitting device.

SUMMARY OF THE DISCLOSURE

The present disclosure provides a light-emitting device.

The light-emitting device comprises: a substrate; a first light-emitting stack comprising a first active layer; a bonding interface formed between the substrate and the first light-emitting stack; and a contact structure formed on the light-emitting stack and comprising first, second and third contact layers. Each of the first, second and third contact layers comprises a doping material.

BRIEF DESCRIPTION OF THE DRAWINGS

The accompanying drawings are included to provide easy understanding of the application, and are incorporated herein and constitute a part of this specification. The drawings illustrate the embodiments of the application and, together with the description, serve to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of the embodiments of the present disclosure in accordance with the drawings.

Figure 1:
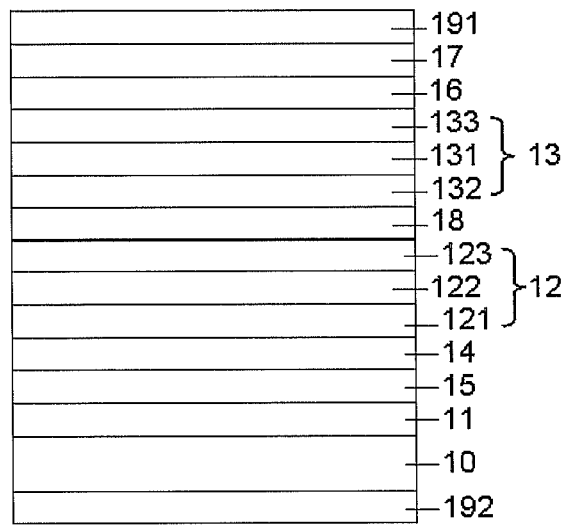
FIG. 1 shows a cross-sectional view of a light-emitting device in accordance with the first embodiment of the present disclosure.

FIG. 1 discloses a light-emitting device 100 according to the first embodiment of the present disclosure. The light-emitting device 100 comprises a substrate 10; a first light-emitting stack 13 disposed on the substrate 10; a contact structure 12 formed on the first light-emitting stack 13 and comprising first, second and third contact layers 121, 122, 123. In this embodiment, the first light-emitting stack 13 comprises a first p-type semiconductor layer 132, a first active layer 131, and a first n-type semiconductor layer 133, and the contact structure 12 is formed between the p-type semiconductor layer 132 of the first light-emitting stack 13 and the substrate 10. The light-emitting device 100 further comprises a bonding layer 11 formed between the substrate 10 and the contact structure 12, a transparent conductive layer 14 formed between the contact structure 12 and the substrate 10, and a mirror layer 15 formed between the transparent conductive layer 14 and the substrate 10. In addition, the light-emitting device 100 further comprises a n-window layer 16 formed on the first light-emitting stack 13, an etching stop layer 17 formed on the n-window layer 16, and a p-window layer 18 formed between the p-type semiconductor layer 132 and the third contact layer 123. An n-electrode 191 and a p-electrode 192 are respectively formed on the etching stop layer 17 and the substrate 10 for electrically connecting to an external electrode (not shown).

In this embodiment, the first contact layer 121 is close to the substrate 10, the third contact layer 123 is close to the first light-emitting stack 13, and the second contact layer 122 is sandwiched between the first and third contact layers 121, 123. The contact structure 12 has a graded bandgap along a direction from the first light-emitting stack 13 to the substrate 10, that is, the first contact layer 121 has a bandgap greater than that of the third contact layer 123, and the second contact layer 122 has a bandgap between that of the first and third contact layers 121, 123.

Moreover, each of the first, second and third contact layers 121, 122, 123 comprises a doping material. The doping material comprises Mg, Be, Zn, C, and combination thereof. Therefore, the first, second, and third contact layers comprise the same conductivity, which is a p-type conductivity in the embodiment. In one embodiment, the doping material in the first contact layer 121 is different from that in the second and/or third contact layers 122, 123. A doping concentration of the first contact layer 121 is higher than the doping concentration of the second and/or third contact layers 122, 123. The doping concentration of the first contact layer 121 is higher than $10^{19}$ for ohmically contacting the transparent conductive layer 14, and the doping concentration of each of the second and third contact layers 122, 123 is higher than $10^{18}$. It is noted that the conductivity of the first, second, and third contact layers 121, 122, 123 can be different. For example, the second contact layer 122 has an n-type conductivity, and the first and third contact layers 121, 123 have a p-type conductivity; or the first and second contact layers 121, 122 have a p-type conductivity, and the third contact layer 123 has an n-type conductivity such that there is a tunnel effect between the first, second, and third contact layers 121, 122, 123. The doping concentration of the first, second, and third contact layers is higher than $10^{19}$ for obtaining the tunnel effect.

In this embodiment, the first light-emitting stack 13 and the contact structure 12 comprise different materials. For example, the first contact layer 121 comprises GaAsP or $(Al_xGa_{1-x})_yIn_{1-y}P$; $0 \leq x \leq 0.1$; $0.9 \leq y \leq 1$. The second contact layer 122 comprises $(Al_xGa_{1-x})In_{1-y}P$; $0.05 \leq x \leq 0.3$;

$0.45 \leq y \leq 0.55$. The third contact layer 123 comprises $(Al_xGa_{1-x})_yIn_{1-y}P$; $0 \leq x \leq 0.1$; $0.45 \leq y \leq 0.55$. Each of the first n-type semiconductor layer 133, the first active layer 131, and the first p-type semiconductor layer 132 comprises AlGaAs, InGaAs, or GaAs. The contact structure 12 has a thickness ranging from 50 nm to 280 nm. The first contact layer 121 has a thickness ranging from 35 nm to 120 nm, the second contact layer 122 has a thickness ranging from 10 nm to 80 nm, and the third contact layer 121 has a thickness ranging from 5 nm to 80 nm. The bonding layer 11 comprises metal. The metal comprises gold (Au), indium (In), tin (Sn), and combinations thereof. The etching stop layer 17 comprises InGaP or GaAs.

Figure 2A:
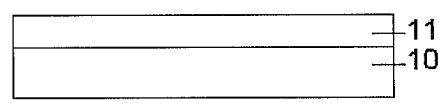
FIGS. 2A to 2D are cross-sectional views showing a method of making the light-emitting device in accordance with the first embodiment of the present disclosure.
Figure 2B:
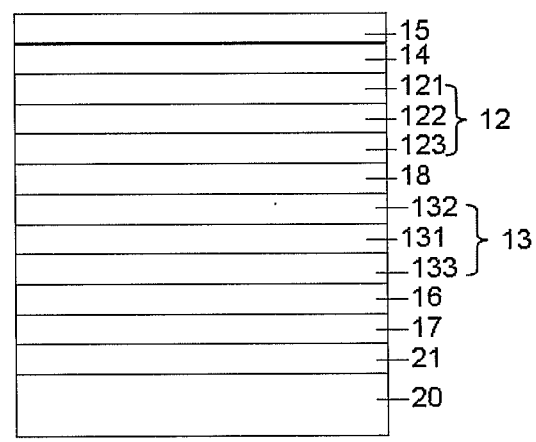
Figure 2C:
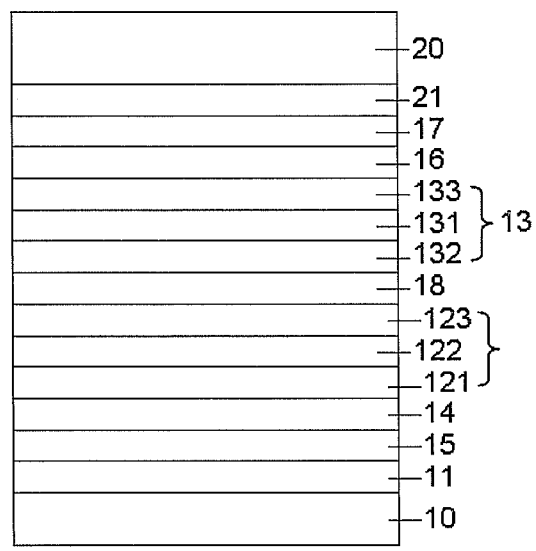
Figure 2D:
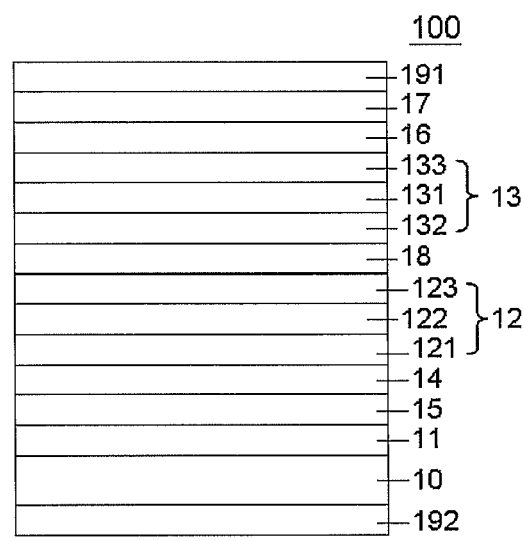

FIGS. 2A and 2B are cross-sectional views showing a method of making the light-emitting device of the first embodiment. Referring to FIG. 2A, the bonding layer 11 is formed on the Si substrate 10. Referring to FIG. 2B, a growth substrate 20 is provided, and a buffer layer 21, the etching stop layer 17, the n-window layer 16, the first light-emitting stack 13, the p-window layer 18, and the contact structure 12 are subsequently formed on the growth substrate 20 by epitaxial growth. The transparent conductive layer 14 is formed on the contact structure 12 and the mirror layer 15 is formed on the transparent conductive layer 14. Referring to FIG. 2C, the substrate 20 is bonded to the mirror layer 15 through the bonding layer 11, thereby forming a bonding interface therebetween. Subsequently, the buffer layer 21 is removed to separate the growth substrate 20 and the etching stop layer 17. The n-electrode 191 and the p-electrode 192 are respectively formed on the etching stop layer 17 and the substrate 10 to form the light-emitting device 100, as shown in FIG. 2D.

Figure 3:
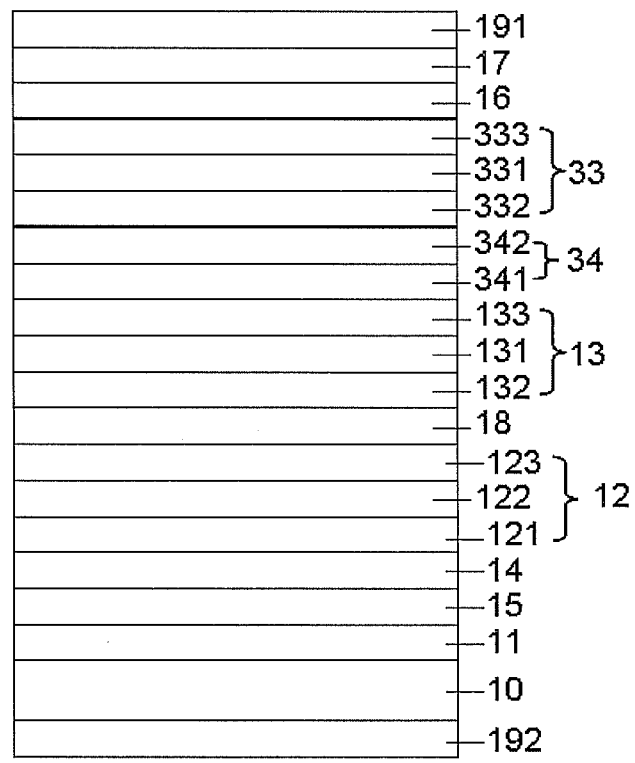
FIG. 3 shows a cross-sectional view of a light-emitting device in accordance with the second embodiment of the present disclosure.

FIG. 3 shows a light-emitting device 200 according to the second embodiment of the present disclosure. The second embodiment of the light-emitting device 200 further comprises a second light-emitting stack 33 vertically formed on the first light-emitting stack 13. The second light-emitting stack 33 comprises a second p-type semiconductor layer 332, a second active layer 331, and a second n-type semiconductor layer 333. Each of the second n-type semiconductor layer 333, the second active layer 331, and the second p-type semiconductor layer 332 comprises AlGaAs, InGaAs, or GaAs. Each of the first and second active layer 131, 331 emits light having a wavelength ranging from 840 nm to 860 nm. In another embodiment, the first and second active layers 131, 331 emit light having the same wavelength. Furthermore, the light-emitting device 200 comprises a tunnel junction 34 formed between the first and second light-emitting stacks 13, 33. The tunnel junction 34 comprises an n-type layer 341 and a p-type layer 342. Each of the n-type layer 341 and the p-type layer 342 comprises GaAs, AlGaAs, InGaP, or AlGaInP. The n-type layer 341 has a thickness of 20 nm-160 nm, and the p-type layer 342 has a thickness of 20 nm-120 nm.

EXAMPLES

Example 1 (E1)

The light-emitting device has a structure as shown in FIG. 1. The buffer layer 21 of n-GaAs, the etching stop layer 17 of n-InGaP, the n-window layer 16 of AlGaAs, the n-type semiconductor layer 133 of AlGaAs, the active layer 131 of AlGaAs/InGaAs, the p-type semiconductor layer 132 of AlGaAs, the third contact layer 123 of Zn-doped InGaP, the second contact layer 122 of Zn-doped AlGaInP and the first contact layer 121 of C-doped GaP are sequentially grown on the growth substrate 20 of GaAs. The transparent conductive layer 14 made of ITO is formed on the first contact layer 121 by evaporating or sputtering. The mirror layer 15 comprising a multi-layer structure of Ag/Ti/Pt/Au is formed on the transparent conductive layer 14. The substrate 10 made of Si is bonded to the mirror layer 15 by the bonding layer 11 of Au/In using metal bonding process, and then the GaAs buffer layer 11 is etched so as to remove the growth substrate 20 from the etching stop layer 17. Subsequently, the p-type electrode 192 is formed on the substrate 10 and the n-type electrode 191 is formed on the etching stop layer 17.

It is noted that the substrate 10 can be bonded to the mirror layer 14 by a direct bonding without the bonding layer 11. The direct bonding is performed under a temperature of 200-500° C. and a pressure ranging from 1 mtorr to 760 torr, and a composite material is formed at the interface between the substrate 10 and the mirror layer 14 during the direct bonding process for forming the bonding interface therebetween.

Example 2 (E2)

Figure 4:
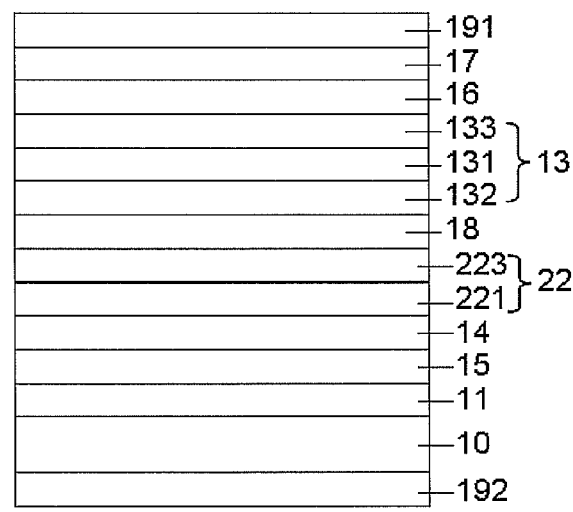
FIG. 4 is a cross-sectional view of a light-emitting device in accordance with Example 2 of the present disclosure

The light-emitting device of Example 2 has a similar structure with that of Example 1, except that the contact structure 22 comprises two layers of the first and third contact layer 221, 223, as shown in FIG. 4.

TABLE 1

|  | V (volt) | Po (watt) |
|---|---|---|
| E1 | 1.59 | 859.1 |
| E2 | 1.63 | 858.8 |

Table 1 shows experimental results of Examples 1 and 2. The light-emitting device of Example 1 has the operation voltage (V) of 1.59 volt at a current 100 mA and the power (Po) of 859.1 watt. The light-emitting device of Example 2 has the operation voltage (V) of 1.63 volt at a current 100 mA and the power (Po) of 858.8 watt. The light-emitting device of Example 1 has a lower operation voltage than that of Example 2, which indicates the second contact layer 222 having a bandgap energy between that of the first and third contact layers 221, 223 can reduce the operation voltage.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:
1. A light-emitting device comprising:
    a substrate;
    a first light-emitting stack comprising a first active layer;
    a bonding interface formed between the substrate and the first light-emitting stack; and
    a contact structure comprising a first contact layer, a second contact layer, and a third contact layer,
    wherein each of the contact layers comprises a doping material, and
    wherein the contact structure has a bandgap decreasing from the substrate to the first light-emitting stack.
2. The light-emitting device of claim 1, wherein the contact structure is formed between the first light-emitting stack and the bonding interface.
3. The light-emitting device of claim 1, wherein the first light-emitting stack and the contact structure comprise different materials.

4. The light-emitting device of claim 1, wherein the first contact layer comprises GaAsP or $(Al_xGa_{1-x})_yIn_{1-y}P$; $0 \leq x \leq 0.1$; $0.9 \leq y \leq 1$.

5. The light-emitting device of claim 1, wherein the second contact layer comprises $(Al_xGa_{1-x})_yIn_{1-y}P$; $0.05 \leq x \leq 0.3$; $0.45 \leq y \leq 0.55$.

6. The light-emitting device of claim 1, wherein the third contact layer comprises $(Al_xGa_{1-x})_yIn_{1-y}P$; $0 \leq x \leq 0.1$; $0.45 \leq y \leq 0.55$.

7. The light-emitting device of claim 1, wherein the doping material of the first contact layer is different from that of the second contact layer, the third contact layer, or both thereof.

8. The light-emitting device of claim 1, wherein the doping material in the first contact layer comprises C, the doping material in the second contact layer and the third contact layer comprises Zn.

9. The light-emitting device of claim 1, further comprising a bonding layer formed between the substrate and the first light-emitting stack to form the bonding interface.

10. The light-emitting device of claim 1, further comprising a transparent conductive layer formed between the contact structure and the bonding interface.

11. The light-emitting device of claim 10, further comprising a mirror layer formed between the transparent conductive layer and the bonding interface.

12. The light-emitting device of claim 1, wherein the contact layers have the same conductivity.

13. The light-emitting device of claim 12, wherein the conductivity is p-type conductivity.

14. The light-emitting device of claim 13, wherein a doping material of the p-type conductivity comprises Mg, Be, Zn, or C.

15. The light-emitting device of claim 12, wherein the first contact layer has a doping concentration higher than those of the second contact layer and the third contact layer.

16. A light-emitting device comprising:
a substrate;
a light-emitting stack comprising a first semiconductor layer of a first-type conductivity, an active layer, and a second semiconductor layer of a second-type conductivity;
a bonding interface formed between the substrate and the light-emitting stack; and
a contact structure formed between the first semiconductor layer and the bonding interface, and comprising a first contact layer, a second contact layer, and a third contact layer,
wherein the first contact layer comprises a first doping material of the first-type conductivity and a first doping concentration, the second contact layer comprises a second doping material of the first-type conductivity and a second doping concentration, and the third contact layer comprises a third doping material of the first-type conductivity and a third doping concentration,
wherein the first contact layer is closer to the first semiconductor layer than the third contact layer, and the third contact layer is closer to the substrate than the first contact layer, and
wherein the first doping concentration, the second doping concentration and the third doping concentration are different from each other, and the first doping concentration is lower than the second doping concentration and is lower than the third doping concentration.

17. The light-emitting device of claim 16, wherein the first-type conductivity is a p-type conductivity.

18. The light-emitting device of claim 16, wherein each of the first doping concentration, the second doping concentration and the third doping concentration is higher than $10^{19}$ cm$^{-3}$.

* * * * *